(12) United States Patent
Shukh et al.

(10) Patent No.: US 6,667,616 B1
(45) Date of Patent: Dec. 23, 2003

(54) SPIN VALVE SENSOR HAVING INCREASED GMR RATIO AND DECREASED SENSITIVITY TO CROSSTALK NOISE

(75) Inventors: Alexander M. Shukh, Savage, MN (US); Edward S. Murdock, Edina, MN (US); Anthony M. Mack, Minneapolis, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/380,457

(22) PCT Filed: Sep. 2, 1999

(86) PCT No.: PCT/US99/20151
§ 371 (c)(1),
(2), (4) Date: Sep. 2, 1999

(87) PCT Pub. No.: WO00/63715
PCT Pub. Date: Oct. 26, 2000

Related U.S. Application Data

(60) Provisional application No. 60/130,154, filed on Apr. 20, 1999.

(51) Int. Cl.[7] ............................................. G01R 33/02
(52) U.S. Cl. .................................. 324/252; 324/207.21
(58) Field of Search ........................ 324/252, 207.21, 324/207.2; 360/113, 126, 324.11, 324.12; 338/32 R, 32 M

(56) References Cited

U.S. PATENT DOCUMENTS 5,206,590 A * 4/1993 Dieny et al. ............... 324/252
5,465,185 A * 11/1995 Heim et al. ................ 360/113
5,889,640 A * 3/1999 Hayashi et al. ............ 360/113

FOREIGN PATENT DOCUMENTS

| EP | 0 845 820 A3 | 11/1997 | ............. H01L/8/43 |
| EP | 0 845 850 A2 | 11/1997 | ............. H01L/8/43 |

OTHER PUBLICATIONS

H.J.M Swagten, et al., Enhanced giant magnetoresistance in spin–valves sandwiched between insulating NiO, Apr. 1, 1996, vol. 53, No. 14.

D. Wang, et al,, Effect of Au Underlayers on GMR Properties of NiFe/Cu/CoFe Sandwiches, Sep., 1996, vol. 32, No. 5.

* cited by examiner

*Primary Examiner*—N. Le
*Assistant Examiner*—Subhash Zaveri
(74) *Attorney, Agent, or Firm*—Kinney & Lange, P.A.

(57) ABSTRACT

A spin valve sensor comprising a ferromagnetic free layer, a ferromagnetic pinned layer, a layer of non-ferromagnetic material positioned between the free layer and the pinned layer, and an antiferromagnetic pinning layer positioned adjacent to the pinned layer such that the pinning layer is in direct contact with the pinned layer. The free layer comprises a multi-layer stack including a non-magnetic insulating spacer positioned between a first and a second ferromagnetic sublayer. The non-magnetic insulating spacer provides a specular electron scattering effect. The first and the second ferromagnetic sublayers each have passive end regions separated by a central active region. The spin valve sensor further includes bias means positioned between the first and the second ferromagnetic sublayers in the passive end regions.

18 Claims, 5 Drawing Sheets

SPIN VALVE SENSOR HAVING INCREASED GMR RATIO AND DECREASED SENSITIVITY TO CROSSTALK NOISE

CROSS-REFERENCE TO RELATED APPLICATION

This application claims priority from Provisional Application No. 60/130,154 filed Apr. 20, 1999 for "Spin Valve Sensor With Specular Electron Scattering in Free Layer" by Alexander M. Shukh, Edward S. Murdock and Anthony M. Mack.

BACKGROUND OF THE INVENTION

The present invention relates generally to a magnetoresistive (MR) sensor based on the spin valve effect for sensing magnetic fields, and more particularly, to such a sensor having a laminated, ferromagnetically coupled free layer with specular electron scattering and an improved longitudinal bias for crosstalk noise suppression.

A magnetic read head retrieves magnetically-encoded information that is stored on a magnetic medium or disc. The magnetic read head is typically formed of several layers that include a top shield, a bottom shield, and a read sensor positioned between the top and bottom shields. The read sensor is generally a type of magnetoresistive sensor, such as a giant magnetoresistive (GMR) read sensor. The resistance of a GMR read sensor fluctuates in response to a magnetic field emanating from a magnetic medium when the GMR read sensor is used in a magnetic read head and positioned near the magnetic medium. By providing a sense current through the GMR read sensor, the resistance of the GMR read sensor can be measured and used by external circuitry to decipher the information stored on the magnetic medium.

A common GMR read sensor configuration is the spin valve configuration in which the GMR read sensor is a multi-layered structure formed of a ferromagnetic free layer, a ferromagnetic pinned layer and a nonmagnetic spacer layer positioned between the free layer and the pinned layer. The magnetization direction of the pinned layer is fixed in a predetermined direction, generally normal to an air bearing surface of the spin valve head, while a magnetization direction of the free layer oscillates freely in response to an external magnetic field. An easy axis of the free layer is generally set normal to the magnetization direction of the pinned layer. The resistance of the spin valve read sensor varies as a function of an angle formed between the magnetization direction of the free layer and the magnetization direction of the pinned layer. This multi-layered spin valve configuration allows for a more pronounced magnetoresistive effect than is possible with anisotropic magnetoresistive (AMR) read sensors.

Typically, the magnetization of the pinned layer is fixed in the predetermined direction by exchange coupling an antiferromagnetic pinning layer to the pinned layer. The antiferromagnetic pinning layer is positioned upon the ferromagnetic pinned layer such that the pinned layer and the free layer form distal edges of the GMR spin valve.

U.S. Pat. No. 5,206,590 (the '590 patent) discloses a spin valve sensor referred to as a magnetoresistive sensor based on the spin valve effect. The spin valve disclosed in the '590 patent includes a free layer with a thickness in the range of 50–150 Å. The '590 patent discloses two longitudinal bias schemes for stabilizing a domain structure of the free layer. One of the schemes is based on an application of hard ferromagnetic films deposited on the edges of the free layer. Alternatively, the '590 patent discloses that the films deposited on the edges of the free layer may be antiferromagnetic material.

The relatively large thickness of the free layer of the spin valve sensor disclosed in the '590 patent results in a reduced giant magnetoresistance due to shunting of a sense current, which causes a reduced output signal. The spin valve sensor according to the prior art also has increased sensitivity to crosstalk noise from adjacent tracks recorded on a medium.

BRIEF SUMMARY OF THE INVENTION

A spin valve sensor is disclosed, comprising a free layer, a pinned layer made of ferromagnetic material, a layer of non-ferromagnetic material positioned between the free layer and the pinned layer, and a pinning layer positioned adjacent to the pinned layer such that the pinning layer is in direct contact with the pinned layer. The free layer comprises a multi-layer stack including a non-magnetic insulating spacer positioned between a first and a second ferromagnetic sublayer. The non-magnetic insulating spacer provides a specular electron scattering effect. The first and the second ferromagnetic sublayers each have passive end regions separated by a central active region. The spin valve sensor further includes bias means positioned between the first and the second ferromagnetic sublayers in the passive end regions. The bias means produces a longitudinal bias in the passive end regions of a level sufficient to maintain the central active region in a single domain state.

The spin valve sensor of the present invention provides a larger GMR ratio and less sensitivity to crosstalk noise than prior art spin valve sensors. The increased GMR ratio is provided by initiating a specular electron scattering effect in the free layer, and thereby localizing electrons within a portion of the free layer where a probability of spin-dependent scattering is a maximum. A reduction in sensitivity to crosstalk noise is provided by positioning means for producing a longitudinal bias between end regions of thin ferromagnetic sublayers of the free layer stack.

DETAILED DESCRIPTION

Figure 1:
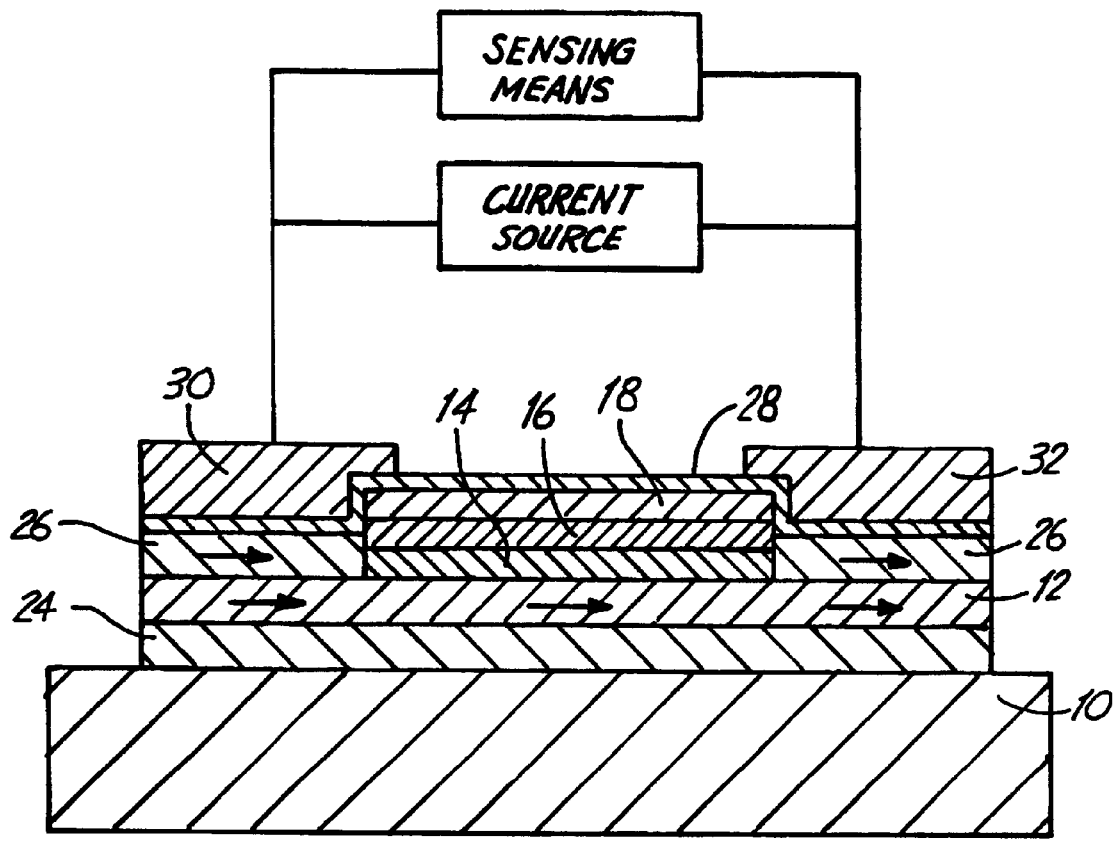
FIG. 1 shows a first embodiment of a prior art spin valve sensor.

Prior to describing the spin valve sensor of the present invention, some specific embodiments of prior art spin valve sensors will be discussed. FIG. 1 shows a spin valve sensor disclosed in U.S. Pat. No. 5,206,590. The spin valve includes a multilayer formed of two ferromagnetic layers 12 and 16 separated by nonmagnetic metallic spacer 14. Ferromagnetic layer 12 is free to oscillate in response to a magnetic field, whereas ferromagnetic layer 16 is pinned by antiferromagnetic layer 18. The '590 patent discloses two longitudinal bias schemes for stabilizing a domain structure of free layer 12. One of the schemes is based on an application of hard ferromagnetic films 26 deposited on the edges of free layer 12. Alternatively, the '590 patent discloses that films 26 may be antiferromagnetic material. The thickness of free layer 12 is in the range of 50–150 Å.

Figure 2:
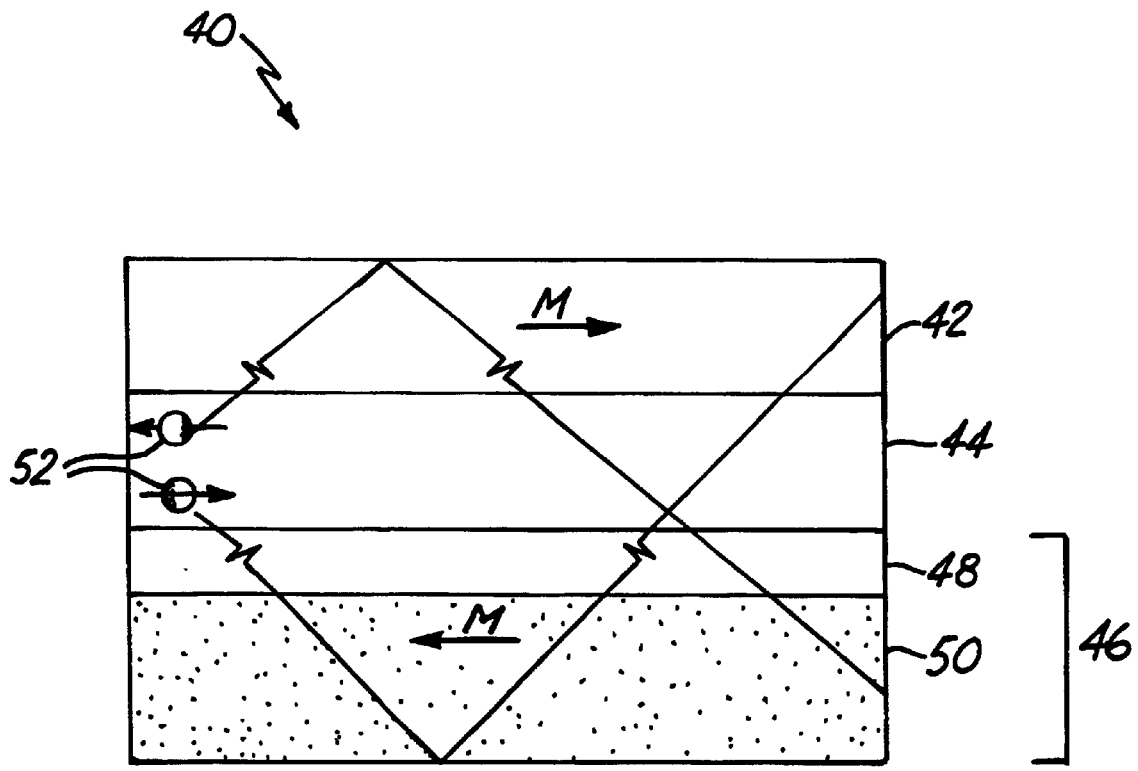
FIG. 2 shows a diagram of spin dependent scattering in a prior art spin valve sensor.

FIG. 2 shows a diagram of spin dependent scattering in a prior art spin valve sensor 40. Spin valve 40 includes ferromagnetic pinned layer 42, non-magnetic spacer layer 44 and ferromagnetic free layer 46. To improve the sensitivity and thermal stability of the spin valve 40, free layer 46 is made of two ferromagnetic layers 48 and 50, such as Co/NiFe, in direct contact with each other. As shown by the arrows in FIG. 2, at certain conditions, the magnetizations of the ferromagnetic layers 42 and 46 can be antiparallel. Due to their large thickness, ferromagnetic layers 42 and 46 provide a high mean free path for electrons 52, which results in a low GMR ratio. The mean free path is mostly limited by the presence of boundary scattering at the top of ferromagnetic layer 42 and the bottom of ferromagnetic layer 50.

Giant magnetoresistance is a product of spin-dependent scattering of electrons in antiferromagnetically coupled ferromagnetic layers. The scattering is spin-dependent because up-spin electrons are scattered differently than down-spin electrons. If an up-spin electron encounters a ferromagnetic layer with a downward magnetization, the electron will likely be scattered, resulting in a reduced mean free path and increased resistance. On the other hand, if the up-spin electron encounters a ferromagnetic layer with an upward magnetization, the probability of scattering is reduced and the resistance is lower. Likewise, down-spin electrons are more frequently scattered by up-magnetization ferromagnetic layers, and less frequently scattered by down-magnetization ferromagnetic layers.

Spin-dependent scattering is mostly localized in a few monolayers of the ferromagnetic layers 42 and 46 adjacent to the ferromagnetic/nonmagnetic interfaces with nonmagnetic layer 44. The larger the spin-dependent scattering, the larger the GMR ratio. The probability of the spin-dependent scattering and GMR decrease with the increase of the pinned or free layer thickness.

Figure 3:
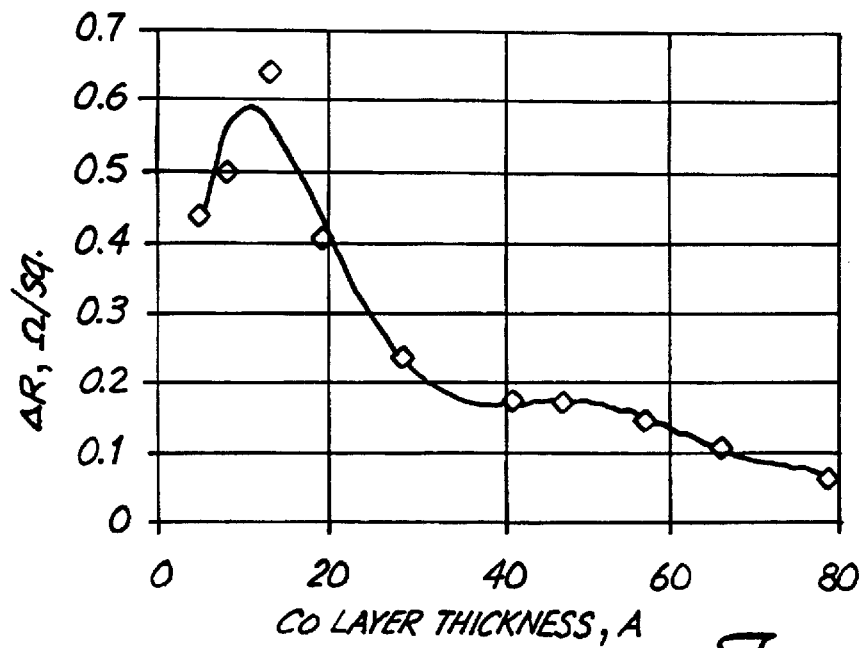
FIG. 3 shows a graph of GMR magnitude versus Co layer thickness in a $(Co(t)/Cu(19 \text{ Å}))_{20}$ multilayer stack.

FIG. 3 shows a graph of ΔR or GMR (vertical axis) versus Co layer thickness (horizontal axis) in a $(Co(t)/Cu(19 \text{ Å}))_{20}$ multilayer stack. As shown in FIG. 3, the maximum of the giant magnetoresistance occurs at a thickness of about 10–15 Å. GMR decreases with an increase in ferromagnetic layer thickness.

In addition to producing a low GMR, a thick ferromagnetic free layer also results in a decrease of the exchange coupling field with. a longitudinal bias means, such as layer 26 in the '590 patent (See FIG. 1). The decrease in the exchange coupling field results in an increase of the free layer sensitivity to crosstalk noise.

Figure 4:
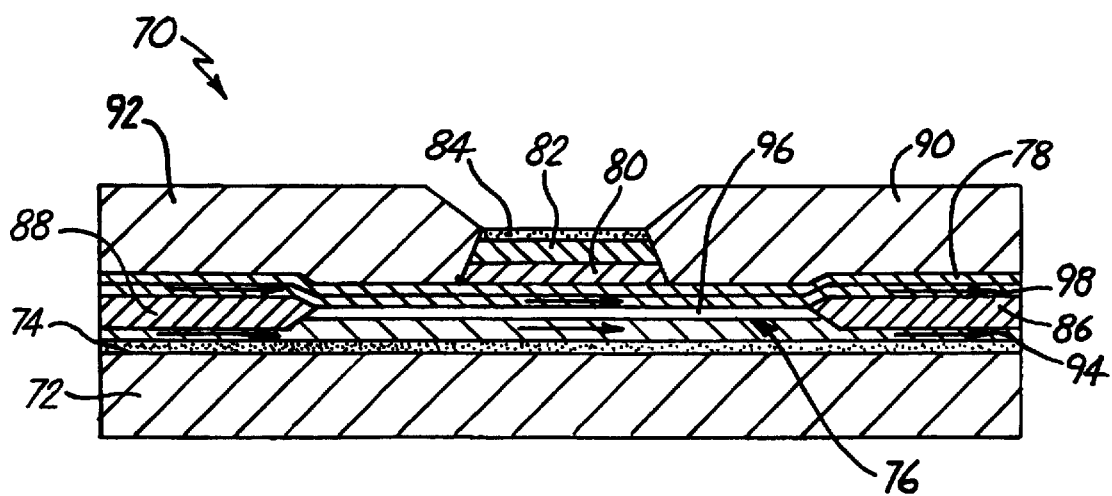
FIG. 4 shows a preferred embodiment of a spin valve sensor according to the present invention.

A preferred embodiment of a spin valve sensor 70 according to the present invention is shown in FIG. 4. Spin valve sensor 70 includes substrate 72, seed layer 74, ferromagnetic free layer 76, non-magnetic spacer 78, ferromagnetic pinned layer 80, antiferromagnetic pinning layer 82, capping layer 84, antiferromagnetic tabs 86 and 88 and conductor leads 90 and 92. Free layer 76 is preferably a multi-layer structure including ferromagnetic sublayers 94 and 98 separated by non-magnetic insulating spacer 96. Ferromagnetic sublayers 94 and 98 may be made from NiFe, Co, CoFe, NiFeCo, CoZr as well as other similar soft magnetic materials. In a preferred embodiment, ferromagnetic sublayer 94 is NiFe and ferromagnetic sublayer 98 is CoFe. Ferromagnetic sublayer 98 may also comprises a multilayer structure including two ferromagnetic layers, such as Co/NiFe, CoFe/NiFe, Co/NiFeCo or CoFe/NiFeCo. In such cases, the Co or CoFe layer of ferromagnetic sublayer 94 is preferably positioned adjacent to spacer 78. Non-magnetic metallic spacer 78 is preferably Cu, Ag or Au.

To maintain a magnetization orientation in the pinned layer 80 perpendicular to the ABS, the pinned layer 80 is exchange coupled with the antiferromagnetic pinning layer 82. A capping layer 84, preferably made of Ta, is deposited over pinning layer 82 and protects the multilayer structure of sensor 70 from oxidation. Conductor leads 90 and 92 are provided to form a circuit path between the sensor 70, current source and sensing means (not shown).

Seed layer 74 is deposited prior to deposition of free layer 76. Seed layer 74 is preferably made of Ta, NiFeCr, Ru or CrV. Seed layer 74 preferably has a high resistivity to minimize a shunting effect. The purpose of seed layer 74 is to optimize a texture, grain size and morphology of the subsequent layers. For example, it is desirable to have a certain degree of roughness at the interface between ferromagnetic layer 80 and spacer 78, and between ferromagnetic layer 76 and spacer 78. The roughness facilitates transfer of electrons from spacer 78 to the ferromagnetic layers 76 and 80, where spin-dependent scattering occurs. However, the interfaces can not be made too rough or the GMR effect is lost. The morphology is critical in obtaining a large GMR effect since it permits the use of very thin free layer 76 and non-magnetic spacer 78.

In the spin valve sensor 70 of the present invention, the conventional single layer or Co/NiFe bilayer structure of the free layer is replaced by a laminated structure comprising at least two ferromagnetic sublayers 94 and 98 separated by a thin insulating film 96 providing ferromagnetic coupling between ferromagnetic sublayers 94 and 98. The laminated free layer 76 according to the present invention preferably has a general structure of Co/MO$_x$/NiFe, where MO$_x$ is an insulator. The insulating film 96 is of an appropriate type and thickness to allow the two ferromagnetic films 94 and 98 to be ferromagnetically coupled to one another. In a preferred embodiment, insulating film 96 is an Al$_2$O$_3$ film of approximately 2–10 Å thick. The insulating spacer 96 can alternatively be made of a thin film of Fe$_2$O$_3$, Fe$_3$O$_4$, NiO, Ta$_2$O$_5$, SiO$_2$, Si$_3$N$_4$, CoO, TiO$_2$, or other insulating material. Free layer 76 with the laminated structure has lower coercivity and a more stable domain structure than a bilayer or single-layer structure due to a ferromagnetic coupling between ferromagnetic films 94 and 98.

Moreover, the laminated structure of free layer 76 with insulating spacer 96 improves the GMR effect in spin valve sensor 70. Insulating spacer 96 initiates a specular electron scattering effect at its interface with ferromagnetic layer 98. Specular electron scattering in spin valves is discussed in H. J. M. Swagten, G. J. Strijkers, R. H. J. N. Bitter, W. J. M. de Jonge, J. C. S. Kools, *Specular Reflection in Spin Valves Bounded by NiO Layers*, IEEE Transactions on Magnetics, v.34, No.4, pp. 948–953 (1998). By placing insulating spacer 96 between ferromagnetic sublayers 94 and 98, the mean free path of electrons in free layer 76 is considerably reduced, as can be seen in FIG. 5.

Figure 5:
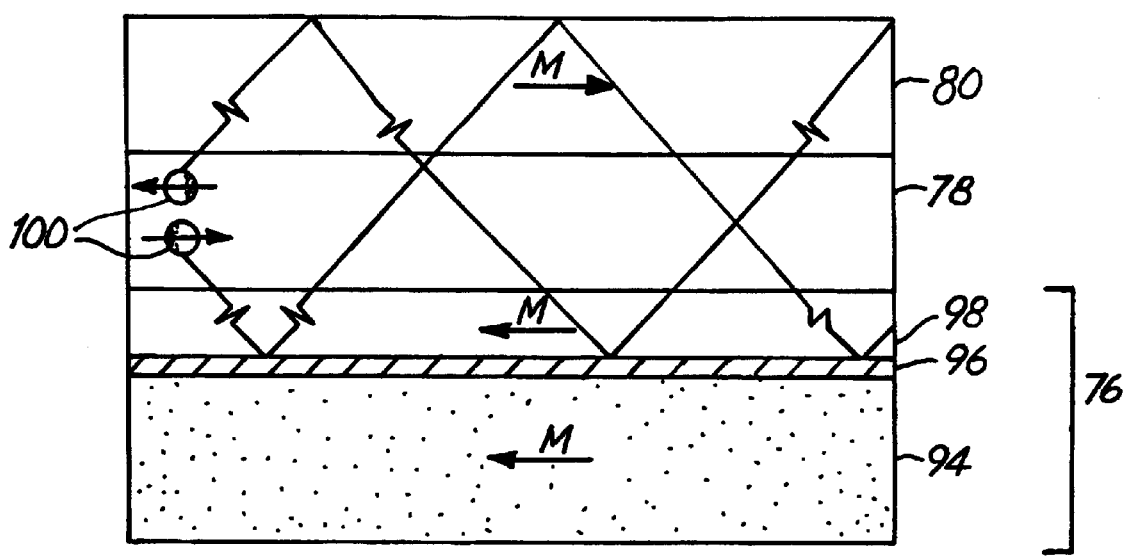
FIG. 5 shows a diagram of spin dependent scattering in a portion of the spin valve sensor of the present invention.

FIG. 5 shows a portion of spin valve sensor 70, including ferromagnetic pinned layer 80, non-magnetic spacer layer 78, and free layer 76 comprising ferromagnetic sublayer 98, insulating spacer 96 and ferromagnetic sublayer 94. The arrows in FIG. 5 represent the magnetization directions of the various ferromagnetic layers. Electrons 100 are localized in the thin portion of free layer 76 formed by the ferromagnetic film 98 adjacent to the metallic non-magnetic spacer 78, where a probability of the spin-dependent scattering is a maximum. Localizing electrons 100 in ferromagnetic film 98 results in an increase of the spin-dependent scattering and the giant magnetoresistance. Insulating spacer 96 is preferably positioned close to the interface between non-magnetic spacer 78 and ferromagnetic layer 98 to increase the number of passes of electrons 100 through the region of high spin-dependent scattering. Ferromagnetic film 98 is preferably in the range of 10–20 Å thick, which is the thickness producing the maximum GMR as shown in FIG. 3. Ferromagnetic film 94 is preferably 20–60 Å thick.

Referring again to FIG. 4, means for producing a longitudinal bias are provided to maintain free layer 76 in a single domain state as indicated by the arrows on free layer 76. In the specific embodiment shown, the means 86 and 88 for producing a longitudinal bias comprise a layer of antiferromagnetic material having a high blocking temperature and exhibiting a high exchange coupling with the ferromagnetic films 94 and 98. The antiferromagnetic tabs 86 and 88 are positioned between and in direct contact with end regions of the ferromagneuc films 94 and 98. The thickness of each ferromagnetic film 94 and 98 is lower than the total thickness of the free layer 76 consisting of these films and the insulating spacer 96.

Figure 6:
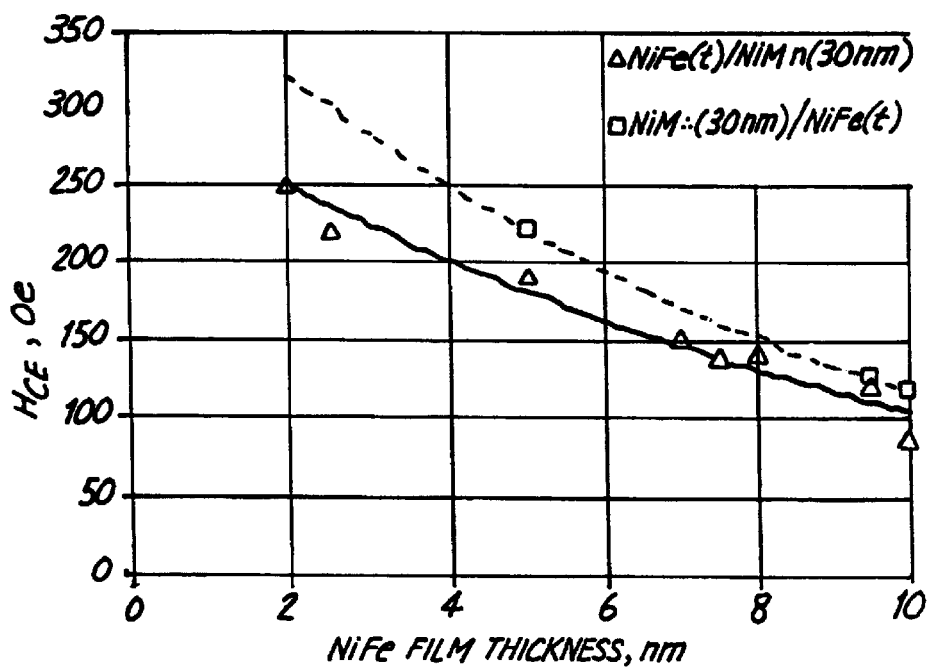
FIG. 6 shows a graph of coercivity of the end regions of the ferromagnetic sublayers of the free layer versus thickness of these sublayers.
Figure 7:
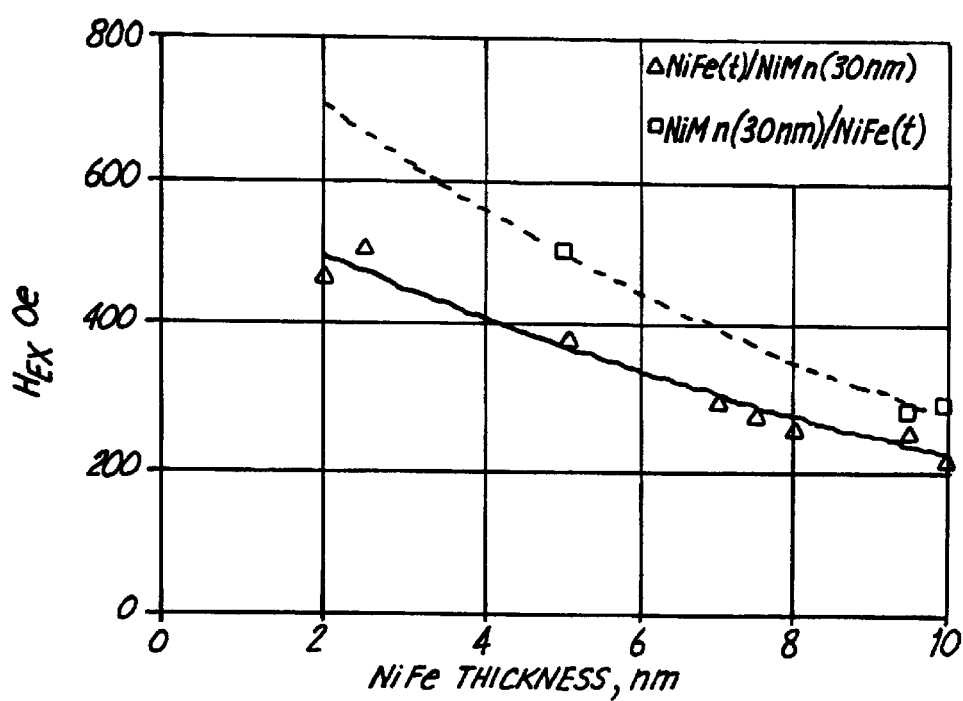
FIG. 7 shows a graph of exchange coupling strength between the antiferromagnetic biasing layers and the end regions of the ferromagnetic sublayers of the free layer, versus thickness of the sublayers.

FIG. 6 shows a graph of the coercivity ($H_{CE}$) of the end regions of ferromagnetic layers 94 and 98 versus thickness of these layers. FIG. 7 shows a graph of the exchange coupling strength ($H_{EX}$) between the antiferromagnetic tabs 86 and 88 and the end regions of ferromagnetic sublayers 94 and 98 versus thickness of ferromagnetic sublayers 94 and 98. The broken lines in FIGS. 6 and 7 represent data for a NiFe ferromagnetic film 98 of varying thickness and a 30 nm thick NiMn antiferromagnetic tab 86. The solid lines in FIGS. 6 and 7 represent data for a NiFe ferromagnetic film 94 of varying thickness and a 30 nm thick NiMn antiferromagnetic tab 86. Thus, for the broken lines, the ferromagnetic film is positioned above the antiferromagnetic tab, and for the solid lines, the ferromagnetic film is positioned below the antiferromagnetic tab.

As shown in FIG. 6 and FIG. 7, the exchange coupling field ($H_{EX}$) and coercivity ($H_{CE}$) increases with a decrease in the thickness of the ferromagnetic sublayers 94 and 98. In the present invention, the antiferromagnetic tabs 86 and 88 are placed between the ferromagnetic films 94 and 98 forming free layer 76. The thickness of each ferromagnetic sublayer 94 and 98 is less than the total thickness of free layer 76, and less than the thickness of prior art free layers. Thus, the exchange coupling $H_{EX}$ and coercivity $H_{CE}$ of the end regions of the thin ferromagnetic sublayers 94 and 98 is much higher than in the prior art. As a result, the magnetic sensitivity of the end regions of free layer 76 in the present invention is considerably lower than in the prior art, which results in better suppression of crosstalk noise.

Although the present invention has been described with reference to preferred embodiments, workers skilled in the art will recognize that changes may be made in form and detail without departing from the spirit and scope of the invention.

What is claimed is:

1. A spin valve sensor comprising:
   a spin valve stack including a multi-layer free layer; and
   means positioned within the multi-layer free layer for providing a specular electron scattering effect at interface within the multi-layered free layer.

2. The spin valve sensor of claim 1 wherein the multi-layer free layer comprises:
   a multi-layer stack including a non-magnetic insulating spacer positioned between a first and a second ferromagnetic sublayer, and wherein the non-magnetic insulating spacer provides the specular electron scattering effect.

3. The spin valve sensor of claim 2 wherein the spin valve stack comprises:
   a pinned layer;
   a layer of non-ferromagnetic material positioned between the free layer and the pinned layer, the layer of non-ferromagnetic material in direct contact with the first ferromagnetic sublayer of the free layer; and
   a pinning layer positioned adjacent to the pinned layer such that the pinning layer is in direct contact with the pinned layer.

4. The spin valve sensor of claim 2 wherein the first and the second ferromagnetic sublayers each have passive end regions separated by a central active region, the spin valve sensor further comprising bias means positioned between the first and the second ferromagnetic sublayers in the passive end regions of the first and the second ferromagnetic sublayers, the bias means producing a longitudinal bias in the passive end regions of a level sufficient to maintain the central active region in a single domain state.

5. The spin valve sensor of claim 2 wherein the first and the second ferromagnetic sublayers are each one of NiFe, Co, CoFe, NiFeCo and CoZr.

6. The spin valve sensor of claim 3 wherein the first ferromagnetic sublayer comprises a multilayer structure including a first and a second ferromagnetic layer.

7. The spin valve sensor of claim 6 wherein the first ferromagnetic layer of the first ferromagnetic sublayer is one of Co and CoFe and the second ferromagnetic layer of the first ferromagnetic sublayer is one of NiFe and NiFeCo, and wherein the first ferromagnetic layer of the first ferromagnetic sublayer is positioned adjacent to the layer of non-ferromagnetic material.

8. The spin valve sensor of claim 2 wherein the non-magnetic insulating spacer is one of $SiO_2$, $Fe_2O_3$, $Fe_3O_4$, NiO, $Ta_2O_5$, $A_2O_3$, $Si_3N_4$, CoO, and $TiO_2$.

9. The spin valve sensor of claim 2 wherein the non-magnetic insulating spacer is of an appropriate thickness to allow ferromagnetic coupling between the first and the second ferromagnetic sublayers.

10. The spin valve sensor of claim 9 wherein the non-magnetic insulating spacer is about 2–10 Å thick.

11. The spin valve sensor of claim 2 wherein the first ferromagnetic sublayer is about 10–20 Å thick.

12. The spin valve sensor of claim 11 wherein the second ferromagnetic sublayer is about 20–60 Å thick.

13. The spin valve sensor of claim 3 wherein the layer of non-ferromagnetic material is one of Cu, Ag and Au.

14. A spin valve sensor comprising:
   a spin valve stack including a free layer, the free layer comprising a multilayer stack including a first and a second ferromagnetic sublayer, the first and the second ferromagnetic sublayers each having passive end regions separated by a central active region; and
   bias means positioned between the first and the second ferromagnetic sublayers in the passive end regions of the first and the second ferromagnetic sublayers, the bias means producing a longitudinal bias in the passive end regions of a level sufficient to maintain the central active region in a single domain state.

15. The spin valve sensor of claim 14 wherein the free layer further comprises a spacer sublayer positioned between the first and the second ferromagnetic sublayers in the central active region of the first and the second ferromagnetic sublayers.

16. The spin valve sensor of claim 15 wherein the spacer sublayer provides a specular electron scattering effect.

17. The spin valve sensor of claim 14 wherein the spin valve stack comprises:

a pinned layer;

a layer of non-ferromagnetic material positioned between the free layer and the pinned layer; and a pinning layer positioned adjacent to the pinned layer such that the pinning layer is in contact with the pinned layer.

18. A spin valve sensor comprising:

a spin valve stack including a multi-layer free layer; and means positioned within the multi-layered free layer for localizing electrons within a portion of the free layer where a probability of spin-dependent scattering is a maximum.

* * * * *

UNITED STATES PATENT AND TRADEMARK OFFICE
CERTIFICATE OF CORRECTION

PATENT NO.   : 6,667,616 B1
DATED        : December 23, 2003
INVENTOR(S)  : Alexander M. Shukh et al.

It is certified that error appears in the above-identified patent and that said Letters Patent is hereby corrected as shown below:

Column 3,
Line 51, delete "with. a" and insert -- with a --

Column 4,
Line 1, delete "comprises" and insert -- comprise --
Line 6, delete "Cu,AgorAu" and insert -- Cu, Ag or Au --
Line 37, delete "Co/MO,/NiFe, where MO," and insert -- Co/Mo$_x$/NiFe, where MO$_x$ --

Column 14,
Line 57, before "free layer" and insert -- multi-layered --

Signed and Sealed this

Twenty-fourth Day of February, 2004

JON W. DUDAS
*Acting Director of the United States Patent and Trademark Office*